(12) United States Patent
Liu et al.

(10) Patent No.: US 11,574,689 B2
(45) Date of Patent: Feb. 7, 2023

(54) NON-VOLATILE MEMORY DEVICE WITH COMPARISON CAPABILITY BETWEEN TARGET AND READOUT DATA

(71) Applicant: Winbond Electronics Corp., Taichung (TW)

(72) Inventors: Hsing-Yu Liu, Taichung (TW); Jyun-Yu Lai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/234,794

(22) Filed: Apr. 20, 2021

(65) Prior Publication Data

US 2022/0336027 A1 Oct. 20, 2022

(51) Int. Cl.
| | | |
|---|---|---|
| *G11C 16/34* | (2006.01) | |
| *G11C 7/10* | (2006.01) | |
| *G11C 16/10* | (2006.01) | |
| *G11C 16/14* | (2006.01) | |
| *H03K 19/20* | (2006.01) | |
| *H03K 19/017* | (2006.01) | |
| *G11C 16/26* | (2006.01) | |

(52) U.S. Cl.
CPC ........ *G11C 16/3445* (2013.01); *G11C 7/1039* (2013.01); *G11C 7/1057* (2013.01); *G11C 7/1084* (2013.01); *G11C 16/102* (2013.01); *G11C 16/14* (2013.01); *G11C 16/26* (2013.01); *G11C 16/3459* (2013.01); *H03K 19/01742* (2013.01); *H03K 19/20* (2013.01)

(58) Field of Classification Search
CPC ... G11C 16/3445; G11C 16/102; G11C 16/14; G11C 16/26; G11C 16/3459; G11C 7/1039; G11C 7/1057; G11C 7/1084; H03K 19/01742; H03K 19/20
See application file for complete search history.

(56) References Cited

U.S. PATENT DOCUMENTS

| | | | |
|---|---|---|---|
| 2007/0115739 A1* | 5/2007 | Huang | G11C 7/106 365/203 |
| 2011/0161751 A1 | 6/2011 | Maeno et al. | |
| 2015/0098278 A1* | 4/2015 | Lin | G11C 7/1039 365/189.05 |
| 2019/0340125 A1* | 11/2019 | Mondello | G06F 11/1068 |

FOREIGN PATENT DOCUMENTS

TW    I523022    2/2016

OTHER PUBLICATIONS

"Office Action of Taiwan Counterpart Application", dated Jun. 17, 2021, p. 1-p. 5.

* cited by examiner

*Primary Examiner* — Sultana Begum
(74) *Attorney, Agent, or Firm* — JCIPRNET

(57) ABSTRACT

A non-volatile memory device, including a non-volatile memory cell array, a sense amplifier, a random access memory (RAM), and a buffer circuit, is provided. The sense amplifier is configured to generate readout data. The RAM is configured to store write-in data. The buffer circuit generates a detection result according to target data and the readout data, and writes the detection result to the RAM.

15 Claims, 3 Drawing Sheets

NON-VOLATILE MEMORY DEVICE WITH COMPARISON CAPABILITY BETWEEN TARGET AND READOUT DATA

BACKGROUND

Technical Field

The invention relates to a non-volatile memory device, and particularly relates to a non-volatile memory device capable of saving a circuit area.

Description of Related Art

In a framework of a conventional non-volatile memory device, a writing mechanism of the non-volatile memory device requires a static memory, a comparison circuit and a data register. The writing mechanism of the non-volatile memory device includes a program operation, an erase operation, and a soft-program operation. When the above-mentioned writing mechanism is executed, it is required to read data of a memory cell to be written, and then compare the readout data with target data to be written through a comparison circuit, and set a comparison result in the data register. The comparison circuit and the data register required in such framework may consume a certain amount of circuit area and increase the circuit cost.

SUMMARY

The invention is directed to a non-volatile memory device, which is capable of effectively reducing an area of a hardware circuit executing a writing mechanism.

The invention provides a non-volatile memory device including a non-volatile memory cell array, a sense amplifier, a random access memory (RAM) and a buffer circuit. The sense amplifier is coupled to the non-volatile memory cell array, and configured to generate readout data. The RAM is configured to store write-in data. The buffer circuit is coupled to the RAM and the sense amplifier, and generates a detection result according to target data and the readout data, and writes the detection result to the RAM.

Based on the above description, the buffer circuit of the invention may not only provide a writing function to the RAM, but may also perform a detection function on the target data and the readout data, so as to generate the detection result. In this way, in the mechanism in which the non-volatile memory device performs the writing operation, there is no need to additionally provide a comparison circuit and a data register, which effectively reduces hardware requirements and reduces the circuit cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
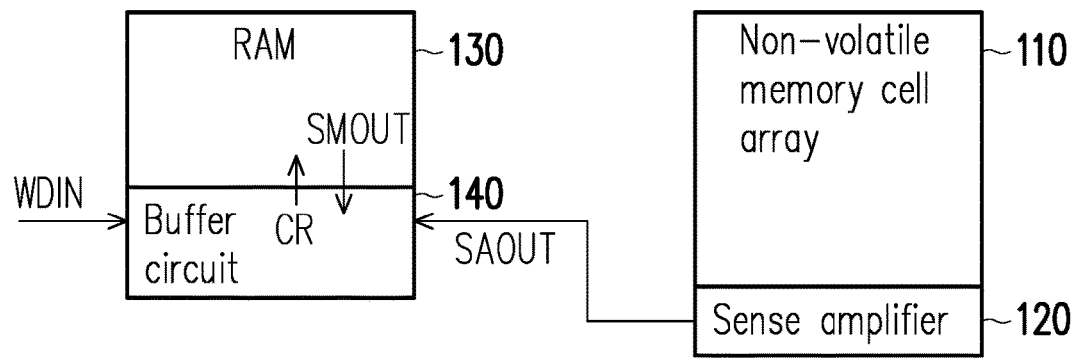
FIG. 1 is a schematic diagram of a non-volatile memory device according to an embodiment of the invention.

Referring to FIG. 1, FIG. 1 is a schematic diagram of a non-volatile memory device according to an embodiment of the invention. The non-volatile memory device 100 includes a non-volatile memory cell array 110, a sense amplifier 120, a random access memory (RAM) 130, and a buffer circuit 140. The sense amplifier 120 is coupled to the non-volatile memory cell array 110. The sense amplifier 120 is configured to sense data provided by one or a plurality of memory cells corresponding to a selected address in the non-volatile memory cell array 110, and generate readout data SAOUT.

The RAM 130 is coupled to the buffer circuit 140. The RAM 130 may be configured to store write-in data. The RAM 130 may receive input data WDIN through the buffer circuit 140, and store the input data WDIN as write-in data SMOUT. The input data WDIN may be sent by an electronic device external to the non-volatile memory device 100 and written into the non-volatile memory cell array 110.

It should be noted that when the non-volatile memory device 100 executes a writing mechanism, the buffer circuit 140 may generate a detection result CR based on target data and the readout data SAOUT, and write the detection result CR to the RAM 130. The above-mentioned writing mechanism includes a program verifying phase, an erase verifying phase, and a soft-program verifying phase. The buffer circuit 140 may set different target data according to different phases of the writing mechanism, and generate the detection result CR.

In detail, in the program verifying phase, the buffer circuit 140 may set the write-in data SMOUT in the RAM 130 as the target data. The buffer circuit 140 may read the write-in data SMOUT from the RAM 130, and the sense amplifier 120 receives the readout data SAOUT read from the non-volatile memory cell array 110. The buffer circuit 140 generates the detection result CR according to the write-in data SMOUT and the readout data SAOUT. In the program verifying phase, the detection result CR may be used to indicate whether the non-volatile memory cell array 110 needs to perform a further program operation.

In the erase verifying phase, the buffer circuit 140 may set the target data to a first logic level, where the first logic level may be a logic level after the non-volatile memory cell is erased, for example, a logic level 1. The buffer circuit 140 compares the readout data SAOUT with the first logic level to generate the detection result CR. In the erase verifying phase, the detection result CR is used to indicate whether the non-volatile memory cell array 110 needs to perform a further erase operation.

In the soft-program verifying phase, the buffer circuit 140 may set the target data to a second logic level, where the second logic level may be a logic level after the non-volatile memory cell is soft-programmed, for example, a logic level 0 (complementary to the first logic level). The buffer circuit 140 compares the readout data SAOUT with the second logic level to generate the detection result CR. In the soft-program verifying phase, the detection result CR is used to indicate whether the non-volatile memory cell array 110 needs to perform a further soft-program operation.

On the other hand, the buffer circuit 140 may write the input data WDIN to the RAM 130 to become the write-in data SMOUT in a data loading phase.

According to the above description, it is learned that the embodiment of the invention uses the buffer circuit 140 to provide detection operations between the readout data SAOUT and the target data in a plurality of phases of the writing mechanism, and the buffer circuit 140 also writes the detection result CR into a buffer interface of the RAM 130. In this way, a required circuit area may be effectively reduced to reduce the circuit cost.

Figure 2:
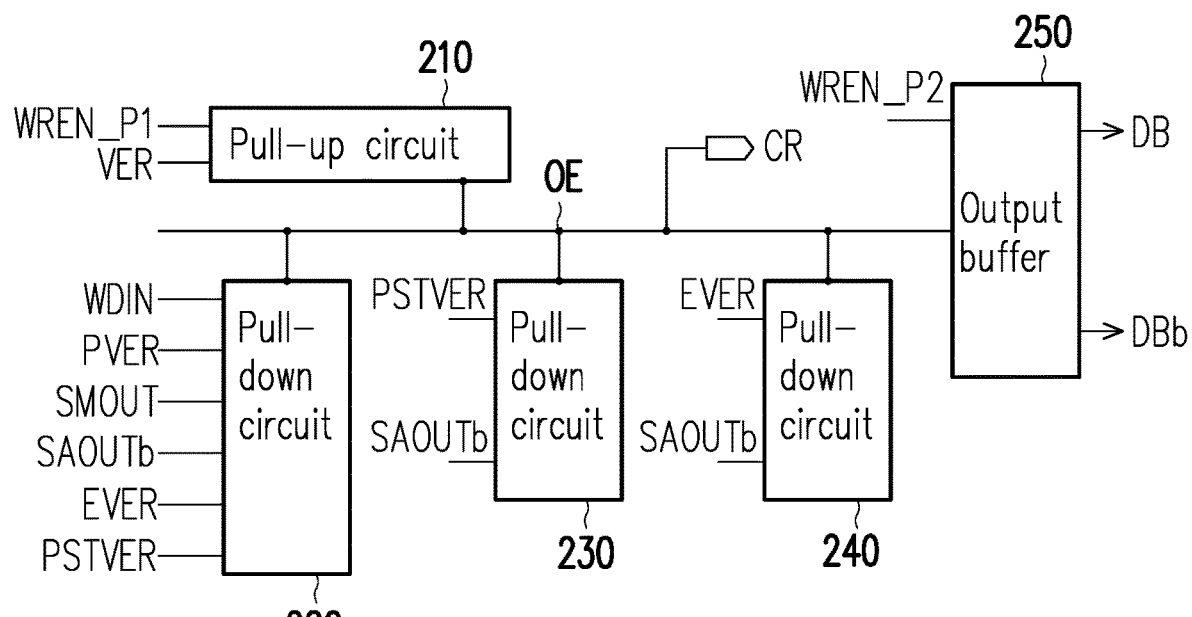
FIG. 2 is a schematic diagram of an implementation of a buffer circuit of a non-volatile memory device according to an embodiment of the invention.

Referring to FIG. 2, FIG. 2 is a schematic diagram of an implementation of a buffer circuit of a non-volatile memory device according to an embodiment of the invention. A buffer circuit 200 includes a pull-up circuit 210, pull-down circuits 220-240, and an output buffer 250. The pull-up circuit 210 is coupled to an output terminal OE, where the output terminal OE is used to provide the detection result CR. The pull-up circuit 210 is used to provide a first driving capability to pull up the detection result CR to a predetermined logic level, and the predetermined logic level may be the logic level 1.

In the embodiment, the pull-up circuit 210 receives a write operation enable signal WREN_P1 and a verifying operation signal VER, and generates the detection result CR according to the write operation enable signal WREN_P1 and the verifying operation signal VER. The write operation enable signal WREN_P1 is used to indicate that the writing mechanism of the non-volatile memory device is activated. The verifying operation signal VER is used to indicate whether the writing mechanism enters the erase verifying phase or the soft-program verifying phase.

The pull-down circuit 220 is coupled to the output terminal OE. The pull-down circuit 220 is used to provide a second driving capability to pull down the detection result CR according to the target data and the readout data in the program verifying phase, where the second driving capability may be greater than the first driving capability. The pull-down circuit 220 receives a program verifying signal PVER, the input data WDIN, an inverted readout data SAOUTb, the write-in data SMOUT, an erase verifying signal EVER, and a soft-program verifying signal PSTVER. The program verifying signal PVER, the erase verifying signal EVER and the soft-program verifying signal PSTVER are respectively used to instruct that the writing mechanism of the non-volatile memory device enters the program verifying phase, the erase verifying phase, and the soft-program verifying phase. In addition, the inverted readout data SAOUTb is an inversion of the readout data SAOUT.

In the data loading phase, the pull-down circuit 220 may select the input data WDIN according to the non-enabled program verifying signal PVER, and determine whether to pull down the detection result CR according to the logic level of the input data WDIN. In the data loading stage, a logic level of the detection result CR may be the same as the logic level of the input data WDIN, and may be written into the non-volatile memory. Then, in the program verifying phase, the pull-down circuit 220 may select the write-in data SMOUT as the target data according to the enabled program verifying signal PVER, and determine whether to pull down the detection result CR according to the readout data SAOUT and the target data. In the embodiment, when the write-in data SMOUT has the logic level 0 and the readout data SAOUT has the logic level 1, the pull-down circuit 220 may pull down the detection result CR to the logic level 0; and when logic states of the write-in data SMOUT and the readout data SAOUT are other combinations, the pull-down circuit 220 may maintain the detection result CR to the logic level 1.

In the embodiment, the detection result CR with the logic level 0 may be used to indicate that the non-volatile memory cell array needs to perform a further program operation. Comparatively, the detection result CR with the logic level 1 may be used to indicate that the non-volatile memory cell array does not need to perform further program operation.

The pull-down circuit 230 is coupled to the output terminal OE. In the soft-program verifying phase, the pull-down circuit 230 compares the target data (with the logic level 0) and the inverted readout data SAOUTb to provide a third driving capability to pull down the detection result CR. The third driving capability is greater than the aforementioned first driving capability. In the embodiment, the pull-down circuit 230 receives the soft-program verifying signal PSTVER and the readout data SAOUT. Based on the soft-program verifying signal PSTVER, in the soft-program verifying phase, when the readout data SAOUT has the logic level 1 (not equal to the target data), the pull-down circuit 230 pulls down the detection result CR to the logic level 0. Comparatively, when the readout data SAOUT has the logic level 0 (equal to the target data), the pull-down circuit 230 maintains the detection result CR to the logic level 1. In the embodiment, the detection result CR with the logic level 0 may be used to indicate that the non-volatile memory cell array needs to perform a further soft-program operation. Comparatively, the detection result CR with the logic level 1 may be used to indicate that the non-volatile memory cell array does not need to perform further soft-program operation.

The pull-down circuit 240 is coupled to the output terminal OE. In the erase verifying phase, the pull-down circuit 240 compares the target data (with the logic level 1) and the readout data SAOUT to provide a fourth driving capability to pull down the detection result CR. The fourth driving capability is greater than the aforementioned first driving capability. In the embodiment, the pull-down circuit 240 receives the erase verifying signal EVER and the readout data SAOUT. Based on the erase verifying signal EVER, in the erase verifying phase, when the readout data SAOUT has the logic level 0 (not equal to the target data), the pull-down circuit 240 pulls down the detection result CR to the logic level 0. Comparatively, when the readout data SAOUT has the logic level 1 (equal to the target data), the pull-down circuit 240 maintains the detection result CR to the logic level 1. In the embodiment, the detection result CR with the logic level 0 may be used to indicate that the non-volatile memory cell array needs to perform a further erase operation. Comparatively, the detection result CR with the logic level 1 may be used to indicate that the non-volatile memory cell array does not need to perform further erase operation.

The output buffer 250 is also coupled to the output terminal OE, and receives the detection signal CR and a write operation enable signal WREN_P2. When the write operation enable signal WREN_P2 is enabled (for example, with the logic level 1), the output buffer 250 generates first data DB and second data DBb according to the detection result CR, where the first data DB and the second data DBb are complementary. The output buffer 250 also makes the first data DB and the second data DBb to have sufficient driving capability to be written into the RAM.

Figure 3:
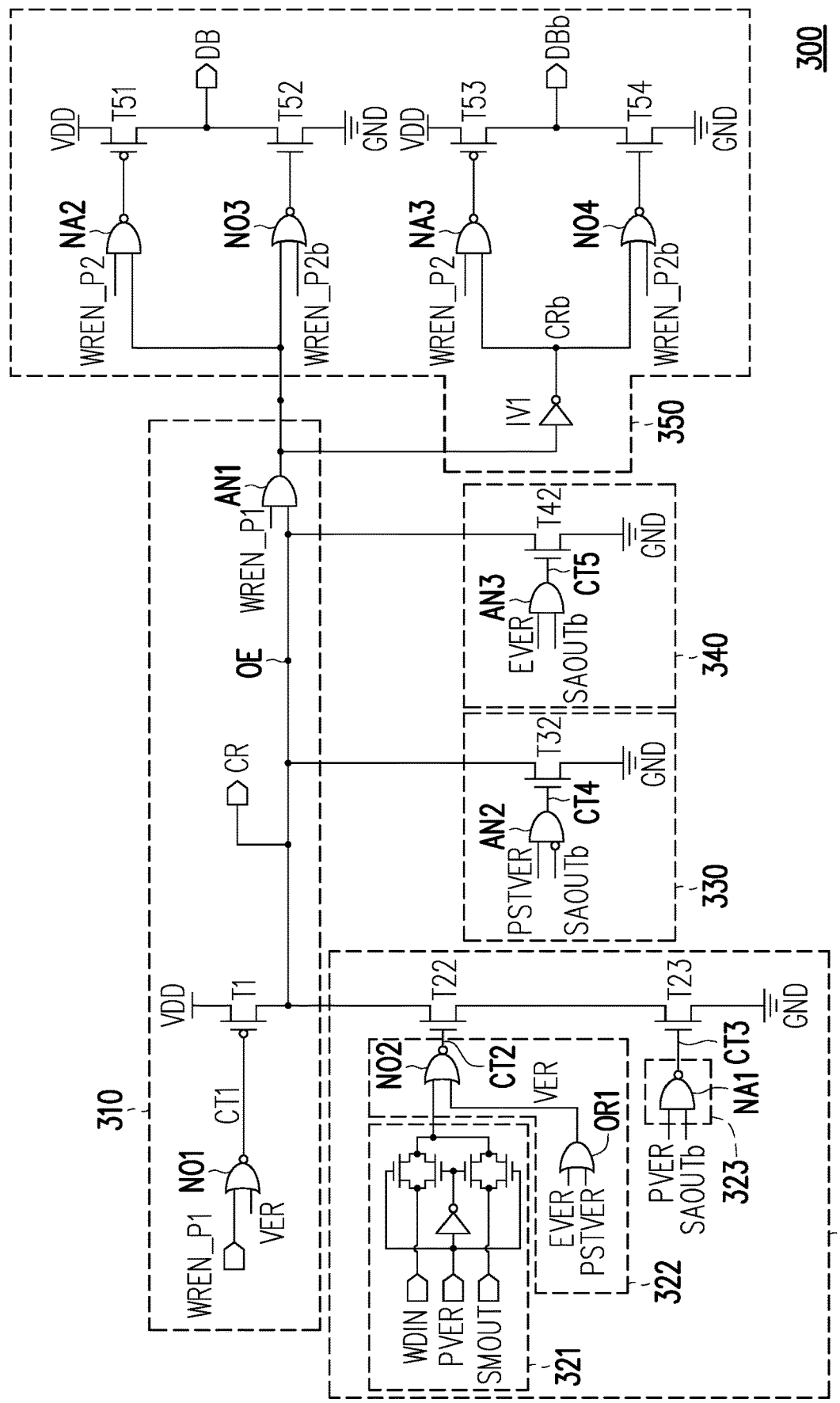
FIG. 3 is a circuit diagram of an implementation of a buffer circuit of a non-volatile memory device according to an embodiment of the invention.

Referring to FIG. 3, FIG. 3 is a circuit diagram of an implementation of a buffer circuit of a non-volatile memory device according to an embodiment of the invention. A buffer circuit 300 includes a pull-up circuit 310, pull-down circuits 320-340 and an output buffer 350. The pull-up circuit 310 includes a transistor T1 and two logic circuits respectively composed of a NOR gate NO1 and an AND gate AN1. The NOR gate NO1 is used to receive the write operation enable signal WREN_P1 and the verifying operation signal VER, and perform a NOR logic operation on the write operation enable signal WREN_P1 and the verifying operation signal VER to generate a signal CT1. A first terminal of the transistor T1 receives a reference voltage VDD, a control terminal of the transistor T1 receives the signal CT1, and it is determined whether to pull up the detection result CR on the output terminal OE coupled to a second terminal of the transistor T1 according to the signal CT1. In addition, the AND gate AN1 receives the detection result CR and the write operation enable signal WREN_P1, and determines whether to output the detection result CR to the output buffer 350 according to the write operation enable signal WREN_P1, where the AND gate AN1 is used to perform an AND logic operation.

The pull-down circuit 320 includes a selector 321, logic circuits 322 and 323, and transistors T22 and T23. The selector 321 selects the input data WDIN or the write-in data SMOUT according to the program verifying signal PVER to generate selected data. The logic circuit 322 includes a NOR gate NO2 and an OR gate OR1. The NOR gate NO2 receives the aforementioned selected data and an output of the OR gate OR1 (the verifying operation signal VER) to perform the NOR logic operation to generate a control signal CT2. The OR gate OR1 receives the erase verifying signal EVER and the soft-program verifying signal PSTVER to perform the OR logic operation to generate the verifying operation signal VER.

A first terminal of the transistor T22 is coupled to the output terminal OE, a control terminal thereof receives the control signal CT2, and a second terminal thereof is coupled to a first terminal of the transistor T23. A second terminal of the transistor T23 is coupled to a reference ground terminal GND, and a control terminal thereof receives a control signal CT3. The control signal CT3 is generated by the logic circuit 323, where the logic circuit 323 includes a NAND gate NA1. The NAND gate NA1 receives the program verifying signal PVER and the inverted readout data SAOUTb to perform a NAND logic operation, so as generate the control signal CT3.

The pull-down circuit 330 includes a transistor T32 and a logic circuit composed of an AND gate AN2. The AND gate AN2 receives the soft-program verifying signal PSTVER and the inverted readout data SAOUTb to generate a control signal CT4. An input terminal of the AND gate AN2 that receives the inverted readout data SAOUTb is an inverted input terminal. Therefore, the AND gate AN2 performs the AND logic operation on the soft-program verifying signal PSTVER and an inversion of the inverted readout data SAOUTb to generate the control signal CT4. The transistor T32 is coupled between the output terminal OE and the reference ground terminal GND, and is controlled by the control signal CT4. When the transistor T32 is turned on, the detection result CR on the output terminal OE may be pulled down to the logic level 0.

The pull-down circuit 340 includes a transistor T42 and a logic circuit composed of an AND gate AN3. The AND gate AN3 receives the erase verifying signal EVER and the inverted readout data SAOUTb to generate a control signal CT5. The AND gate AN3 performs the AND logic operation on the erase verifying signal EVER and the inverted readout data SAOUTb to generate the control signal CT5. The transistor T42 is coupled between the output terminal OE and the reference ground terminal GND, and is controlled by the control signal CT5. When the transistor T42 is turned on, the detection result CR on the output terminal OE may be pulled down to the logic level 0.

The output buffer 350 includes an output stage circuit composed of transistors T51, T52, a NAND gate NA2, and a NOR gate NO3; another output stage circuit composed of transistors T53, T54, a NAND gate NA3 and a NOR gate NO4; and an inverter IV1. The transistors T51 and T52 are serially connected between the reference voltage VDD and the reference ground terminal GND, and are respectively controlled by outputs of the NAND gate NA2 and the NOR gate NO3. The NAND gate NA2 and the NOR gate NO3 have a common input terminal for receiving the detection result CR, and have input terminals for respectively receiving the write operation enable signal WREN_P2 and an inverted write operation enable signal WREN_P2b. The transistors T51 and T52 commonly generate the first data DB.

Moreover, the transistors T53 and T54 are serially connected between the reference voltage VDD and the reference ground terminal GND, and are respectively controlled by outputs of the NAND gate NA3 and the NOR gate NO4. The NAND gate NA3 and the NOR gate NO4 have a common input terminal for receiving an inverted detection result CRb, and have input terminals for respectively receiving the write operation enable signal WREN_P2 and the inverted write operation enable signal WREN_P2b. The transistors T53 and T54 commonly generate the second data DB. The first data DB and the second data DBb are complementary.

In terms of operation details, the pull-down circuit 320 selects the input data WDIN through the selector 321 during the data loading phase to generate the selected data. At this time, the verifying operation signal VER has the logic level 0. When the input data WDIN has the logic level 1, the NOR gate NO2 generates the control signal CT2 with the logic level 0 to turn off the transistor T22. Therefore, the detection result CR is maintained to the logic level 1 (the same as the input data WDIN). Comparatively, in the data loading phase, when the input data WDIN has the logic level 0, the NOR gate NO2 generates the control signal CT2 with the logic level 1 to turn on the transistor T22, and under the condition that the transistor T23 is also turned on, the detection result CR is pulled down to the logic level 0 (the same as the input data WDIN).

The aforementioned detection result CR is written into the RAM through the output buffer 350 in response to the first data DB and the second data DBb when the write operation enable signal WREN_P2 has the logic level 1.

On the other hand, in the program verifying phase, the selector 321 in the pull-down circuit 320 selects the write-in data SMOUT to generate the selected data, and provides the selected data to the NOR gate NO2. Meanwhile, the verifying operation signal VER has the logic level 0. At this time, whether the transistors T22 and T23 are turned on depends on the logic levels of the write-in data SMOUT and the inverted readout signal SAOUTb. When both of the transistors T22 and T23 are turned on, the detection result CR may be pulled down to the logic level 0. On the other hand, when at least one of the transistors T22 and T23 is not turned on, the detection result CR is maintained to the logic Level 1. Therefore, the relationship between the write-in data SMOUT, the readout signal SAOUT, and the detection result CR is shown in a following table 1:

TABLE 1

| SMOUT | SAOUT | CR |
|---|---|---|
| 1 | 1 | 1 |
| 1 | 0 | 1 |
| 0 | 0 | 1 |
| 0 | 1 | 0 |

In the above table 1, when the detection result CR has the logic level 0, it represents that the non-volatile memory cell array needs to perform a further program operation. Comparatively, when the detection result CR has the logic level 1, it represents that the non-volatile memory cell array does not need to perform the further program operation.

In addition, in the soft-program verifying phase, the AND gate AN2 in the pull-down circuit 330 may output the inverted readout data SAOUTb as the control signal CT4 according to the soft-program verifying signal PSTVER with the logic level 1. Therefore, when the inverted readout data SAOUTb has the logic level 0 (the readout data SAOUT has the logic level 1), the transistor T32 is turned on and the detection result CR is pulled down to the logic level 0. Comparatively, when the inverted readout data SAOUTb has the logic level 1 (the readout data SAOUT has the logic level 0), the transistor T32 is turned off, and the detection result CR is maintained to the logic level 1.

In the soft-program verifying phase, when the detection result CR has the logic level 0, it represents that the non-volatile memory cell array needs to perform a further soft-program operation. Comparatively, when the detection result CR has the logic level 1, it represents that the non-volatile memory cell array does not need to perform the further soft-program operation.

In the erase verifying phase, the AND gate AN3 in the pull-down circuit 340 may output the inverted readout data SAOUTb as the control signal CT5 according to the erase verifying signal EVER with the logic level 1. Therefore, when the inverted readout data SAOUTb has the logic level 1 (the readout data SAOUT has the logic level 0), the transistor T42 is turned on, and the detection result CR is pulled down to the logic level 0. Comparatively, when the inverted readout data SAOUTb has the logic level 0 (the readout data SAOUT has the logic level 1), the transistor T42 is turned off, and the detection result CR is maintained to the logic level 1.

In the erase verifying phase, when the detection result CR has the logic level 0, it represents that the non-volatile memory cell array needs to perform a further erase operation. Comparatively, when the detection result CR has the logic level 1, it represents that the non-volatile memory cell array does not need to perform the further erase operation.

It should be noted that in the program verifying phase, the erase verifying phase, and the soft-program verifying phase, the detection result CR may represent a verifying result. In the embodiment, when the detection result CR has the logic level 0, it represents that the verifying result is not passed, and when the detection result CR has the logic level 1, it represents that the verifying result is passed. The verifying result may be transmitted to a logic circuit of a non-random access memory. The logic circuit may control the program operation, the erase operation and the soft-program operation of the non-volatile memory cell array according to the detection result CR.

It should be noted that in the embodiment, the write operation enable signal WREN_P1 may be pulled up to the logic level 1 during the data loading phase, the program verifying phase, the soft-program verifying phase, and the erase verifying phase. The write operation enable signal WREN_P2 may be pulled up to the logic level 1 when the first data DB and the second data DBb are to be generated for outputting according to the detection result CR.

It should be noted that the circuit diagram shown in FIG. 3 is a circuit for processing a single bit. However, in the embodiment of the invention, the numbers of bits of the write-in data SMOUT and the readout data SAOUT are not limited to one. The drawing in FIG. 3 is only for the convenience of explanation. When the write-in data SMOUT and the readout data SAOUT with multiple bits are processed, it may be implemented by duplicating multiple circuits of FIG. 3.

Figure 4:
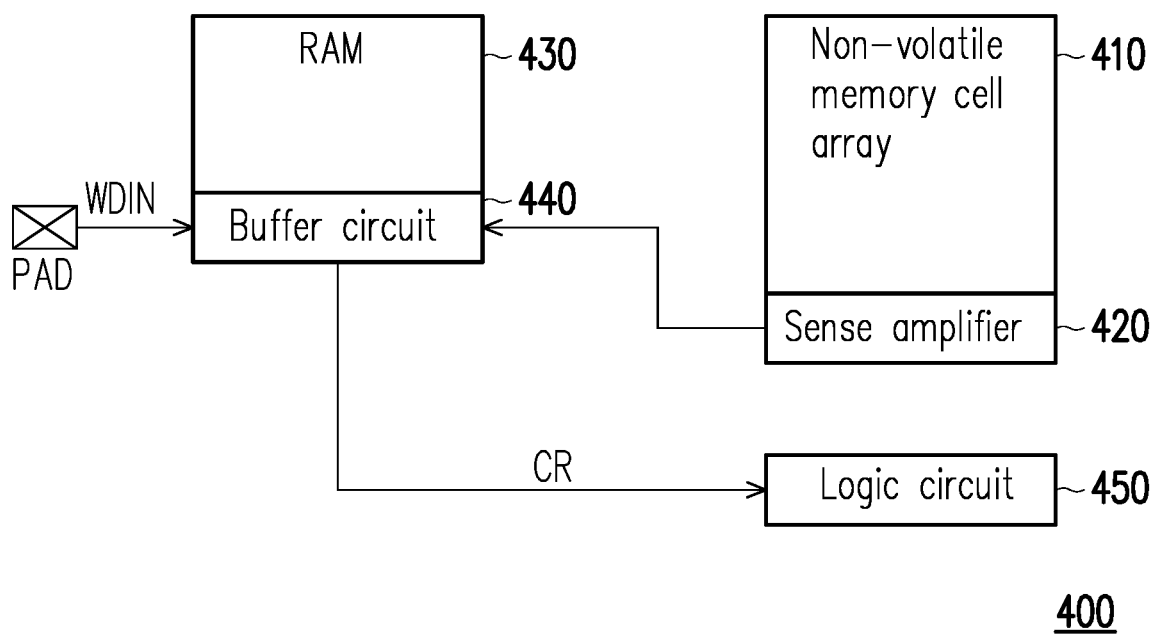
FIG. 4 is a schematic diagram of a non-volatile memory device according to another embodiment of the invention.

Referring to FIG. 4, FIG. 4 is a schematic diagram of a non-volatile memory device according to another embodiment of the invention. A non-volatile memory device 400 includes a non-volatile memory cell array 410, a sense amplifier 420, a RAM 430, a buffer circuit 440, and a logic circuit 450. Different from the embodiment in FIG. 1, the buffer circuit 440 is coupled to an input terminal PAD to receive the input data WDIN, where the input terminal PAD may be a bonding pad on a chip, and the non-volatile memory cell array 410, the sense amplifier 420, the RAM 430, the buffer circuit 440 and the logic circuit 450 are arranged on the same chip. In addition, the buffer circuit 440 is further coupled to the logic circuit 450, and transmits the detection results CR in multiple verifying phases to the logic circuit 450. The logic circuit 450 may determine whether to make the non-volatile memory cell array to execute a further program operation, soft-program operation or erase operation according to the detection result CR.

In the embodiment, the RAM 430 may be a static RAM, and the non-volatile memory cell array may be a flash memory cell array.

In summary, the non-volatile memory device of the invention may perform detection operations of various verifying operations by providing a buffer circuit with detection capability, and may provide a buffer for writing the RAM. In this way, the circuit structure of the non-volatile memory device of the invention may be simplified, which can effectively reduce the cost of the circuit and improve price competitiveness of the product.

What is claimed is:
1. A non-volatile memory device, comprising:
a non-volatile memory cell array;
a sense amplifier, coupled to the non-volatile memory cell may, and configured to generate readout data;
a random access memory, configured to store write-in data; and
a buffer circuit, coupled to the random access memory and the sense amplifier, and generating a detection result according to target data and the readout data, and writing the detection result to the random access memory, wherein the detection result with a first predetermined logic level indicates that the non-volatile memory cell array needs to perform a memory operation, and the detection result with a second predetermined logic level indicates that the non-volatile memory cell array does not need to perform the memory operation.
2. The non-volatile memory device as claimed in claim 1, wherein the buffer circuit further writes input data into the random access memory to become the write-in data in a data loading phase.

3. The non-volatile memory device as claimed in claim 1, wherein in a program verifying phase, the buffer circuit reads the write-in data from the random access memory to serve as the target data.

4. The non-volatile memory device as claimed in claim 1, wherein in an erase verifying phase, the buffer circuit sets the target data to a first logic level, and in a soft-program verifying phase, the buffer circuit sets the target data to a second logic level, wherein the first logic level and the second logic level are complementary.

5. The non-volatile memory device as claimed in claim 1, wherein the buffer circuit comprises:
   a pull-up circuit, providing a first driving capability to pull up the detection result to a predetermined logic level;
   a first pull-down circuit, providing a second driving capability to pull down the detection result according to the target data and the readout data in a program verifying phase;
   a second pull-down circuit, comparing the target data and the readout data to provide a third driving capability to pull down the detection result in a soft-program verifying phase;
   a third pull-down circuit, comparing the target data and the readout data to provide a fourth driving capability to pull down the detection result in an erase verifying phase; and
   an output buffer, receiving the detection result, and outputting the detection result to the random access memory,
   wherein the second driving capability, the third driving capability, and the fourth driving capability are all greater than the first driving capability.

6. The non-volatile memory device as claimed in claim 5, wherein the pull-up circuit comprises:
   a first transistor, having a first terminal receiving a reference voltage, a control terminal receiving a first signal for turning on or off, and a second terminal coupled to an output terminal, wherein the output terminal is configured to provide the detection result; and
   a first logic circuit, receiving a first write operation enable signal and a verifying operation signal, and generating the first signal according to the first write operation enable signal and the verifying operation signal.

7. The non-volatile memory device as claimed in claim 6, wherein the pull-up circuit further comprises:
   a second logic circuit, coupled to the output terminal to receive the detection result, receiving the first write operation enable signal, and determining whether to output the detection result to the output buffer according to the first write operation enable signal.

8. The non-volatile memory device as claimed in claim 7, wherein the first logic circuit performs a NOR logic operation, and the second logic circuit performs an AND logic operation.

9. The non-volatile memory device as claimed in claim 6, wherein the first pull-down circuit comprises:
   a selector, selecting input data or the write-in data to generate selected data according to a program verifying signal;
   a second logic circuit, receiving the selected data and the verifying operation signal, and generating a first control signal according to the selected data and the verifying operation signal;
   a second transistor, having a first terminal coupled to the output terminal, and a control terminal receiving the first control signal;
   a third transistor, coupled in series between a second terminal of the second transistor and a reference ground terminal, and controlled by a second control signal; and
   a third logic circuit, generating the second control signal according to the program verifying signal and the readout data.

10. The non-volatile memory device as claimed in claim 9, wherein the second logic circuit performs a NOR logic operation, and the third logic circuit performs a NAND logic operation.

11. The non-volatile memory device as claimed in claim 6, wherein the second pull-down circuit comprises:
    a second transistor, having a first terminal coupled to the output terminal, and a control terminal receiving a first control signal; and
    a second logic circuit, generating the first control signal according to a soft-program verifying signal and the readout data.

12. The non-volatile memory device as claimed in claim 11, wherein the second logic circuit performs a NAND logic operation.

13. The non-volatile memory device as claimed in claim 6, wherein the third pull-down circuit comprises:
    a second transistor, having a first terminal coupled to the output terminal, and a control terminal receiving a first control signal; and
    a second logic circuit, generating the first control signal according to an erase verifying signal and the readout data.

14. The non-volatile memory device as claimed in claim 13, wherein the second logic circuit performs a NAND logic operation on the erase verifying signal and an inversion of the readout data.

15. The non-volatile memory device as claimed in claim 6, wherein the output buffer comprises:
    a first output stage circuit, generating first data according to the detection result based on a second write operation enable signal; and
    a second output stage circuit, generating second data according to the detection result based on the second write operation enable signal,
    wherein the first data and the second data are complementary.

* * * * *